United States Patent [19]

Maelzer et al.

[11] Patent Number: 4,774,459

[45] Date of Patent: Sep. 27, 1988

[54] ADAPTER FOR A PRINTED CIRCUIT BOARD TESTING APPARATUS

[75] Inventors: Martin Maelzer; Erich Luther, both of Hagenburger Strasse 26, D-3050 Wunstorf; Rüdiger Dehmel, Wunstorf, all of Fed. Rep. of Germany

[73] Assignees: Martin Maelzer; Erich Luther, both of Wunstorf, Fed. Rep. of Germany

[21] Appl. No.: 927,374

[22] Filed: Nov. 6, 1986

[30] Foreign Application Priority Data

Nov. 8, 1985 [DE] Fed. Rep. of Germany ....... 3539720

[51] Int. Cl.$^4$ .......................... G01R 1/073; G01R 1/04
[52] U.S. Cl. ............................ 324/158 F; 324/73 PC
[58] Field of Search ............ 324/158 F, 158 P, 73 PC

[56] References Cited

U.S. PATENT DOCUMENTS

| | | | |
|---|---|---|---|
| 3,654,585 | 4/1972 | Wickersham | 339/17 |
| 3,848,188 | 11/1974 | Ardezzone et al. | 324/73 |
| 4,164,704 | 8/1979 | Kato et al. | 324/73 |
| 4,417,204 | 11/1983 | Dehmel et al. | 324/73 |
| 4,423,376 | 12/1983 | Byrnes et al. | 324/158 |
| 4,535,536 | 8/1985 | Wyss | 29/845 |
| 4,622,514 | 11/1986 | Lewis | 324/158 |
| 4,686,467 | 8/1987 | De Lapp et al. | 324/158 F |

FOREIGN PATENT DOCUMENTS

| | | |
|---|---|---|
| 0050913 | 5/1982 | European Pat. Off. |
| 0145830 | 5/1985 | European Pat. Off. |
| 3110056 | 9/1982 | Fed. Rep. of Germany |
| 2933862 | 3/1985 | Fed. Rep. of Germany |
| 3340184 | 5/1985 | Fed. Rep. of Germany ... 324/158 F |
| 3340180 | 5/1985 | Fed. Rep. of Germany |
| 49270 | 3/1985 | Japan ................................. 324/158 F |
| 2146849 | 4/1985 | United Kingdom ............ 324/158 P |

OTHER PUBLICATIONS

Mania Brochure, "Universalgrund Adapter System", Mania... GmbH, Hauptstrass 86, D-6384 Schmitten 2, W. Germany, no date, pp. 1-7.

Primary Examiner—Reinhard J. Eisenzopf
Assistant Examiner—Stephen M. Baker
Attorney, Agent, or Firm—Fitzpatrick, Cella, Harper & Scinto

[57] ABSTRACT

An adapter (175) for a printed circuit board testing apparatus. The adapter serves to connect testing contacts located in the grid to testing points, located in and/or out of grid, of a printed circuit board to be tested, through adapter pins (181). The adapter pins (181) are conically tapered at their ends facing the testing points. The adapter (175) has a first guide plate (176), a second guide plate (177) and a third guide plate (178) lying in between. The first guide plate (176) only has holes (180) only located in the grid. The second guide plate (177) has holes (179) located in the grid, as well as holes (179a) located out of grid. In order to guarantee that the testing pins (181), with perpendicular introduction into the guide holes (180) of the first guide plate (176), are inevitably always guided into the corresponding guide holes (179, 179a) of the second guide plate (177), the displacement for holes, located out of grid, in the third guide plate (178) is so chosen n that the conical points of the adapter pins (181) in any case still go home into the corresponding guide hole (182a), located out of grid, of the third guide plate (178).

21 Claims, 6 Drawing Sheets

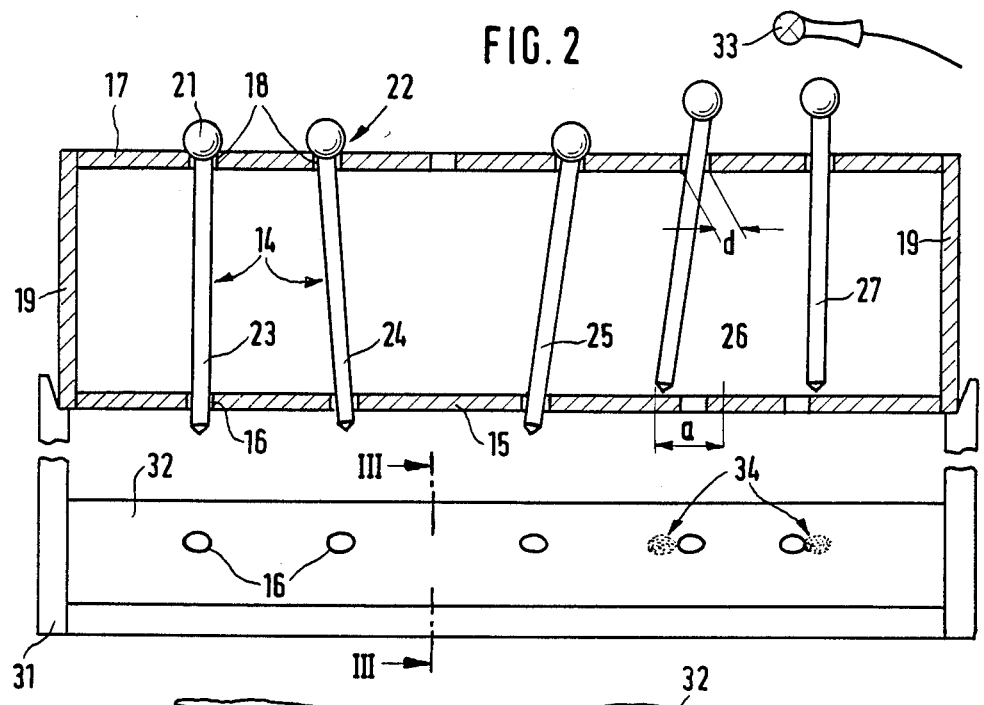
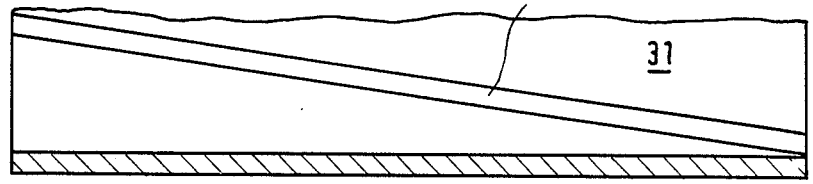
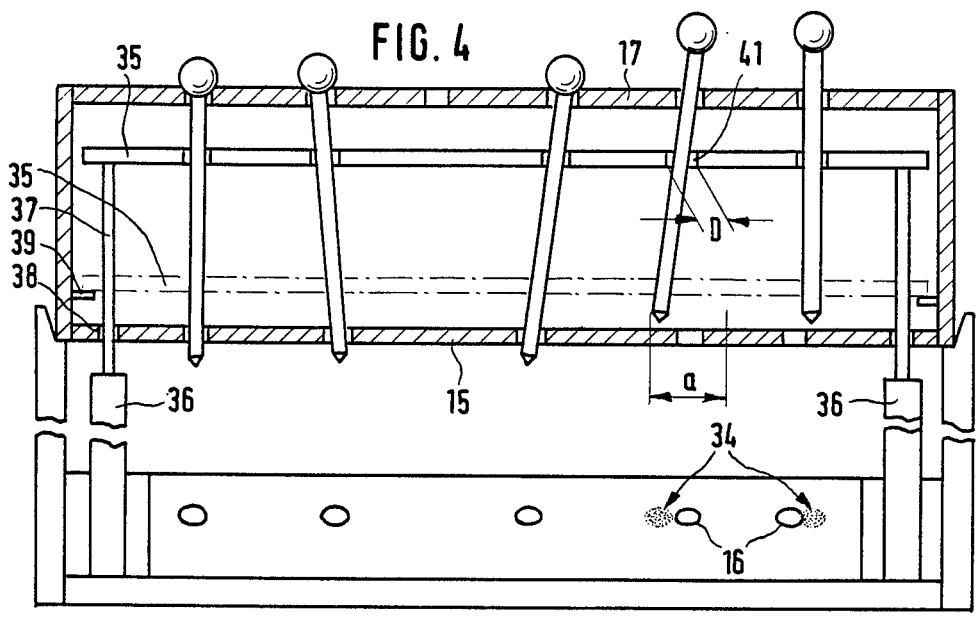

ADAPTER FOR A PRINTED CIRCUIT BOARD TESTING APPARATUS

BACKGROUND OF THE INVENTION

1. Field of the Invention

This invention relates to an adapter for a printed circuit board testing apparatus and more particularly to an adapter which has testing contacts located in a grid and which can be connected through adapter pins to testing points located in and/or out of the grid, of a printed circuit to be tested.

2. Description of the Related Art

Adapters of the type to which this invention relates have a first and a second guide plate, which are arranged parallel to one another and at a distance from one another and have guide holes for the adapter pins, into which the adapter pins can be plugged, in which case the guide holes in the first guide plate are arranged in the grid and in the second guide plate in the pattern of the testing points of the printed circuit to be tested.

An adapter of this type is the subject matter of a prior proposal of the applicant, which comprises the fitting-out of such an adapter both for machine assembly as well as for manual assembly of the adapter. With the embodiment for machine assembly a particular orientation device for the adapter pins is allocated to the adapter, which limits their excursion movements on the introduction of the adapter pins into the guide holes. With the embodiment for manual assembly the adapter is allocated an optically acting additional device, through which the introduction of the adapter pins is made easier.

For adapters of the present type, the requirement exists that, to avoid short circuits, the adapter pins must not touch each other. With the given grid dimensions and necesssary dimensions for the adapter pins, for the guide hole diameter and for the thickness of the guide plates, as well as the distance between the same, the above requirement is not easy to fulfill. As well, it must be taken into account that the adapter pins should be as easy as possible to introduce.

SUMMARY OF THE INVENTION

The underlying object of the invention is to design an adapter of the above described construction at the start, so that mutual contact of adapter pins does not occur and easy running of the adapter pins is guaranteed.

The present invention in one aspect is characterized in that the first guide plate has guide holes at all grid points, and the distance between the first and second guide plates is alterable between a working position, in which the guide plates have a separation shorter than the length of the adapter pins, and an assembly position, in which the guide plates have a separation from another which is reduced compared with the working position. Further, the separation in the assembly position is such that an adapter pin to be introduced into a guide hole of the second plate can, as a result of a maximum angle of deviation of the pin defined by the pin diameter as well as the diameter and length of the guide holes of the first guide plate, be introduced through one of at most four guide holes arranged next to one another in a square in the first guide plate.

With the design according to the invention, through the particular limiting of the angle of deviation of the pin, care is taken that an adapter pin in such a position in which it could touch another adapter pin, cannot be plugged in at all. In order to cause the contact of one adapter pin with another adapter pin, namely one of these two adapter pins would have to be plugged-in into a guide hole of the second guide plate, which is displaced to the allocated grid point by a greater amount than is given through the maximum angle of deviation of the pin. Thus the relevant adapter pin cannot be introduced into such a guide hole.

A further advantage of the distance alteration according to the invention can be seen in the fact that the angles of deviation of the pins actually present diminish when the distance between the guide plates increases. This leads to an increase of the movement clearance of the adapter pins in the guide holes and is in particular of significance for the guide holes in the second guide plate, which are displaced to the allocated grid point by the maximum extent given through the design according to the invention, and into which the relevant adapter pins in each case can just still be introduced with difficulty. According to the distance increase, which results when moving one or both guide plates into the working position, the adapter pins plugging in these maximally displaced guide holes of the second guide plate are also easy-running, which is required for function reasons.

The design according to the invention can likewise be advantageously used both for machine assembly as well as for manual assembly of an adapter with adapter pins.

Through the design according to the invention, moreover, the adapter is considerably simplified and the introduction of the adapter pins made easier than in prior art arrangements. The simplification consists in that, the first guide plate has guide holes at all grid points and is, therefore, the same for all adapters.

By providing a transparent style of the first guide plate, the introduction of the adapter pins with hand assembly is made easier, because the operator is able to recognise optically the guide holes in the second guide plate, into which the adapter pins must be plugged-in. By reason of the pellucid, namely transparent, or almost transparent style character of the first guide plate, the guide holes in the second guide plate are clearly visible. The visibility is improved by the fact that, in the assembly position the guide plates have a relatively small distance from one another, which must be matched with the dimension variables according to the invention.

By providing a particular guide between the first and the second guide plates for adjusting one or the other, the distance alteration can be easily realised. As well, the first guide plate or the second guide plate or also both guide plates can be simultaneously adjusted.

A distance alteration between the guide plates can also be made easier through the allocation of an adjusting mechanism. Such a mechanism is preferred, which fixes the relevant guide plate or the guide plates in the end positions. Spindle drives or cylinder-piston drives may be used as adjusting drives.

The present invention in another aspect is characterized in that the first guide plate has guide holes only at the grid points to which testing contacts are allocated at the printed circuit board and in that a third guide plate which extends between the first and second guide plates likewise only has holes at such grid points to which testing contacts are allocated at the printed circuit board. Further, the guide holes lying out of grid of the third plate are displaced less far, compared with corresponding grid points that the corresponding guide holes lying out of grid, of the second guide plate. The holes in the third guide plate lie in guide alignment between mutually allocated holes in the first and second guide plates.

With this design according to the invention, a mutual contact of adapter pins is avoided through the fact that each required adapter pin is allocated a forced guide, which results in only one plug-in possibility for each adapter pin, i.e. the adapter is 100% reproducible.

This is guaranteed by the fact that every adapter pin plugged into a guide hole of the first guide plate, can only be plugged into a guide hole in the third guide plate which is allocated to a corresponding guide hole in the first guide plate, and which is located in guide alignment with the guide holes, allocated to one another, in the first guide plate and in the second guide plate.

The movement clearance of the relevant adapter pin in the guide hole of the first guide plate and the distance between the first guide plate and the third guide plate, as well as the size of the allocated guide hole in the third guide plate are matched to one another so that, the plug-in end of the adapter pin dips inside the hole edge of the guide hole in the third guide plate into the latter and into the allocated guide hole in the second guide plate. Of advantage are adapter pins which are pointed at their plug-in ends, in which case the arrangement is so met that the pin points lie, with maximum angles of deviation of the pins, within the hole edges of the guide holes in the third and in the second guide plate.

A further advantage of this design according to the invention consists in that, the adapter can be particularly easily filled. Moreover, guide holes must only be bored into the first guide plate in a number which corresponds to the number of testing points on the printed circuit board, i.e. to the number of guide holes in the second guide plate.

With this aspect of the invention, the first guide plate does not need to consist of clear material e.g. plexiglass. It can consist advantageously of a synthetic material made from an epoxy resin, in particular one strengthened by glass fibres, which is considerably easier to bore than, e.g. plexiglass. The strengthening inset in the third guide plate is, therefore of significance, because it reduces with large guide plates the sagging of the guide plates.

The extent of the displacement, with which a guide hole in the third guide plate is displaced compared with the grid point allocated to it, is defined through the relationship of the distances between the first guide plate and the third guide plate and the distance between the third guide plate and the second guide plate. The angle of deviation of the pin results from the guide clearance of the adapter pin in the first guide plate, in which case the pin diameter, the guide hole diameter and the guide hole length have influence.

A large angle of deviation of the pin results inevitably in a large pivoting circle in the region of the third guide plate. In a preferred arrangement of the invention the distance between the second and third guide plates amounts to about 80% of the distance between the first and second guide plates. This is advantageous, because by reason of the necessary movement clearance of the adapter pin in the first guide plate, the excursion circle which can be described by the introduction end of the adapter pin is relatively small, so that with relatively small movement clearance in the guide hole in the third guide plate, blockages when introducing the adapter pin through the free adapter pin end striking on the hole edge of the guide hole in the third guide plate are avoided and, by reason of the relatively small movement clearance in the third guide plate, a striking on the hole edge of the guide hole in the second guide plate is likewise avoided. If the third guide plate were located directly underneath the first guide plate, then an enlarged pivoting circle of the introduction end of the adapter pin would result in the region of the second guide plate. A balanced relationship of the distances of the third guide plate from the first guide plate and the second guide plate is then given, if the distance between the second guide plate and the third guide plate amounts to about 80% of the distance between the first guide plate and the second guide plate.

By providing a translucent lower guide plate, the introduction of the adapter pins can be observed from below by reason of the translucency. This is possible, because the end, of the relevant adapter pin, to be introduced can be recognised either directly or as a silhouette. As a result of this, the adapter pin can be introduced controllably and therefore can be directed according to specific objectives into the guide hole allocated to it.

Furthermore, a transparent lower guide plate is not definitely needed, but rather it also suffices if the lower guide plate is translucent to such an extent that, the adapter pin point to be introduced throws a shadow on it, which can be recognised through the lower guide plate. Hereto a light source is naturally required, which is arranged above the lower guide plate.

The light does not have to be arranged above the adapter pin, for a sideways light source also throws a shadow of the relevant adapter pin onto the lower guide plate, which proceeds from the adapter pin point.

By providing a mirror below the lower guide plate, the control with regard to the viewing position is simplified.

In a preferred arrangement, a central guide plate is arranged between lower and upper guide plates which have guide holes provided in all grid points and which have a diameter which allows limited steering clearance of the adapter pins. With this arrangement, the adapter pins are given, by reason of the enlarged guide holes in the central guide plate, a limited clearance space on all sides, which makes it possible, to steer the adapter pins to and fro, in which case the largest amount of deviation can be pre-determined through the size of the guide holes in this guide plate. Through a suitable size dimensioning of these guide holes the movement clearance space of the adapter pins can be limited to the guide holes lying closest to the adapter pin points to be introduced. Through this limiting, the introduction of the relevant adapter pin point into a guide hole lying farther away is prevented.

By providing a lamp above the upper guide plate and by making the central and/or the upper guide plate translucent, it becomes possible, as already mentioned, to arrange the light source so far above the lower guide plate that the light spreads out somewhat axially to the adapter pins and throws below the adapter pin points small clear shadows onto the lower guide plate. With corresponding selection of the translucency or transparency of the upper plate and of the central guide plate it becomes possible to exploit a usual space lighting from the space ceiling for the shadow formation, according to the invention, on the lower guide plate.

By arranging the central guide plate to move perpendicularly to the lower and upper guide plates, it is possible, to alter the previously mentioned clearance space, on all sides, for the adapter pins, for example according to the present grid size. This becomes possible through a moving of the central guide plate. The further the central guide plate is pushed towards the upper guide plate, the greater this tapering clearance space becomes, in which the adapter pins can be steered to and fro. Should this clearance space be limited, then the central guide plate must be moved in the direction of the lower guide plate, that is, distanced from the upper guide plate.

Since, with an adapter of the present construction type the adapter pins take on different inclinations, the requirement exists for a head development for the adapter pins, which makes possible a close set in the region of the hole edges of the upper guide plate. This requirement is fulfilled, according to a preferred form of the invention by providing adapter pins with spherical heads. By reason of the spherical development of the heads, they always lie fully at the respective hole edge, namely independently of the inclined state of the relevant adapter pin.

According to a further preferred form of the invention a hand lamp is arranged above the upper guide plate. This provides a position-independent lighting which makes it possible to carry out the lighting directed at specific objectives, so that the sought silhouetting on the lower guide plate can be optimally produced.

Since the adapter is a component which is complete in itself, it is recommendable to fasten the mirror to a holder, on which the adapter can be set for the purpose of assembling the adapter pins.

If the mirror is inclined compared with the lower guide plate to the front or rear side of the adapter, the mirror image can be read more easily, through a mirror device comprising two mirrors, e.g. into the eye height of the operator.

According to a further aspect of this invention there is provided a novel adapter for a printed circuit board testing apparatus, by means of which testing contacts located in the grid can be connected to testing points located in and/or out of the grid of a printed circuit board to be tested. In this aspect of the invention adapter pins are provided whose ends turned toward the testing points taper conically, with final and second guide plates, and a third guide plate lying between the first and second plates, all three of which are arranged parallel and at fixed distances to one another and all three of which have guide holes for the adapter pins, with the guide holes of the first plate located in the grid and the guide holes of the second plate located in and-/or out of the grid and coinciding with the testing points of the printed circuit board to be tested. The third plate likewise has guide holes located in and/or out of grid.

This aspect of the invention is characterized in that the holes located out of grid, of the third guide plate, are so placed that the adapter pins on the one hand with perpendicular introduction into the guide holes of the first guide plate in any case still enter, with their conically tapering end, into these guide holes located out of grid, and on the other hand, are, with further introduction, are steered through these guide holes, located out of grid, of the third guide plate, coercively into the out of grid guide holes of the second guide plate. This aspect of the invention makes it possible to dimension individual parts of the adapter so that a simple loading in a short time is guaranteed, in which case the loading efficiency should be as near to 100% as possible. That means that post-loading of individual holes by hand can be eliminated. The adapter should be suitable in particular for loading with an automatic loading system, as is described in DE-OS No. 33 40 184 of the applicant.

According to a still further aspect of the invention there is provided a novel method for indicating locations of errors on a printed circuit board to be tested with testing points located in the and/or out of grid, employing an adapter as above described. This method should make possible a particularly simple direct indication of the error sources or a simple seeking of the locations of errors on the printed circuit board affected by errors. This aspect of the invention is characterized by the steps of supplying to a computer, data representing the co-ordinates of all contact holes of a printed circuit board to be tested, causing the computer to calculate and indicate the co-ordinates of the bore holes for the three adapter guide plates, boring the holes in the three guide plates corresponding to the calculated coordinates, thereafter assembling the adapter from the guide plates, introducing the adapter pins, supplying the adapter with the printed circuit board to be tested to a printed circuit board testing apparatus, causing the testing apparatus to transmit to the computer the data or co-ordinates of those testing contacts located in the grid, which correspond to testing points affected by errors located in and/or out of grid of the printed circuit board, causing the computer, by reason of these data or co-ordinates, to determine the data or coordinates of the testing points located in and/or out of grid and to cause an indicating apparatus to indicate these data or co-ordinates in a manner such that the testing points affected by error may be sought out on the printed circuit board to be tested or marked by means of an error indicating device.

It is a significant point of the mentioned method, that a computer used for calculating the bore diagram for the guide plates of the adaptor can be exploited in addition to convert the data or co-ordinates of the testing contacts determined by the printed circuit board testing apparatus, which correspond to testing points affected by errors, located in the and/or out of grid, of the printed circuit board to be tested, into the data or co-ordinates of the last-named testing points, so that they can either be sought on the printed circuit board or directly marked optically. This conversion is required, because the printed circuit board testing apparatus can only fix the data or co-ordinates of the mentioned testing contacts, which lie on the side of the first guide plate of the adapter, that is in the grid. Desired are, however, the data or co-ordinates of the testing points, affected by errors, on the printed circuit board, lying partially out of grid, which are located on the side of the second guide plate of the adapter. Since the computer knows both the data or co-ordinates of the guide holes of the first guide plate, as well as those of the second guide plate, the conversion is possible without difficulties.

It is possible to indicate the data or co-ordinates of the testing points, affected by errors, of the printed circuits boards to be tested on a monitor and then to seek the testing points affected by errors by means of an optical search system. This optical search system can for example function like a usual drafting machine, with which both co-ordinates of the respective position of the signal head are indicated. The signal head equipped in this case with a magnifying glass system with cross wires can then be driven into that position, which corresponds to the determined co-ordinates.

It is, however, also possible to mark the locations of errors on the printed circuit board to be tested directly, for example through a light point, in which case the light point is thrown onto the printed circuit board by a projector which can be driven in two co-ordinate directions. To the control of the projector the data or co-ordinates determined by the computer are then supplied.

BRIEF DESCRIPTION OF THE DRAWINGS

In the following several embodiments of the invention are described supported by a simplified drawing. There is shown in:

FIG. 2 a perpendicular section through an adapter located on an assembly holder as first embodiment;

FIG. 3 a partial section along the line III-III in FIG. 2;

FIG. 4 a further development of the adapter according to FIG. 2;

In FIG. 1 a receiving plate of the apparatus, not shown completely, for testing printed circuit boards, is designated by 1. On this receiving plate 1 a printed circuit board 2 with testing points 3 is located. Above the printed circuit board 2 to be tested are located a grid hole plate 4, whose holes 5 are arranged in the grid and two modules 6, movable in the direction of the printed circuit board 2 and back, which are provided on their lower fore parts with testing contacts 7 in the form of pins, which, in the driven away position of a module 6, extend through the holes 5 in the grid hole plate 4. The testing contacts 7 carry telescopic testing contact heads 8 which can be driven in and out, which are pre-stressed in the direction of their outer end position by a spring which is not portrayed.

Figure 1:
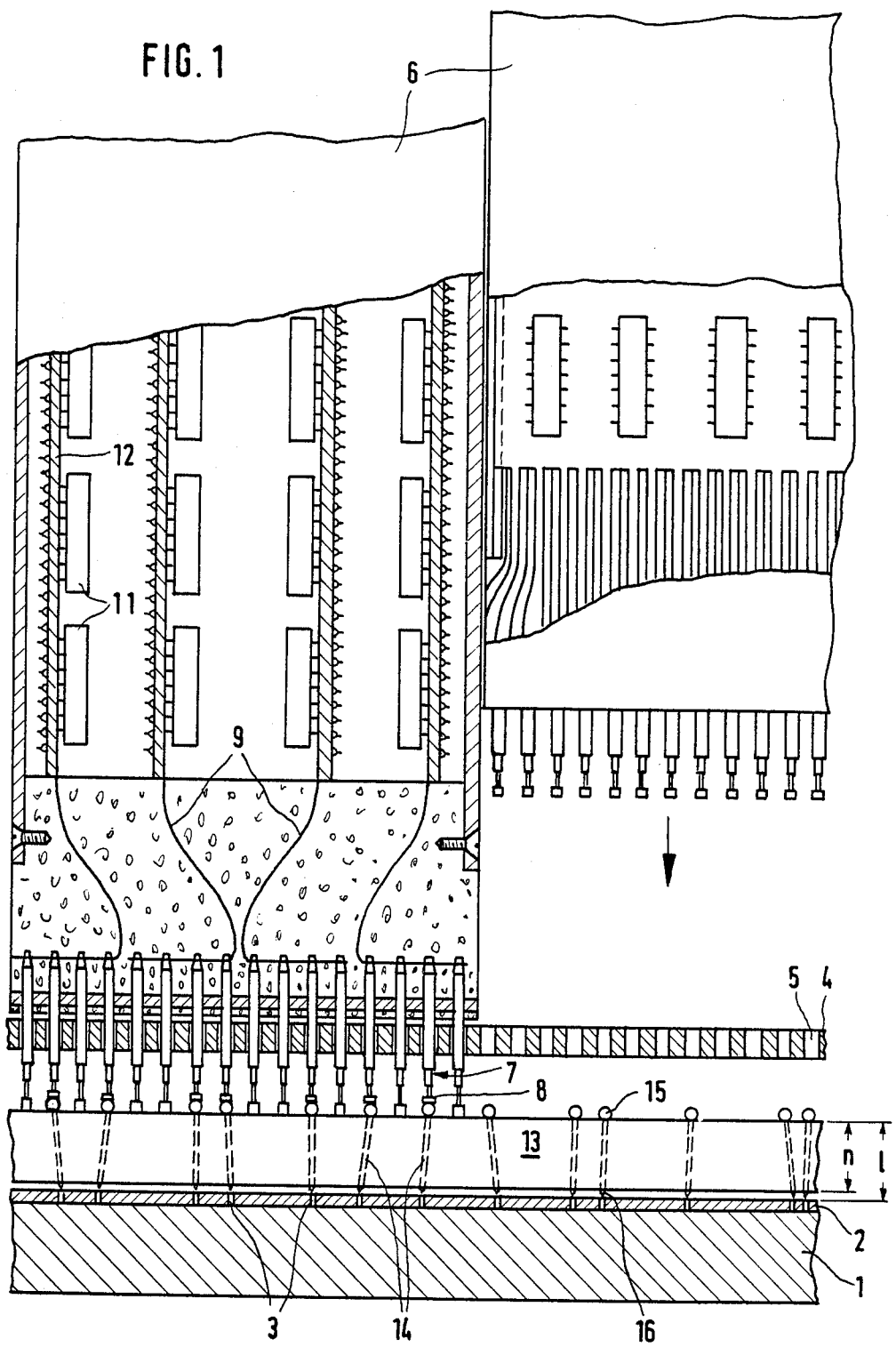
FIG. 1 a partial section through an apparatus for testing printed circuit boards, in which case the partial section runs perpendicular to the adapter, designed according to the invention, received in the apparatus.

The testing contacts 7 are fastened in the modules 6 by encapsulation and stand are connected by electric lines 9 with printed circuit boards 12, carrying IC-chips 11, which are arranged inside the modules 6 and form, in their unity with the printed circuit boards 12 the IC-chips 11 and if necessary further components, a partial circuit matrix allocated to the testing contacts 7.

On the printed circuit board 2 a grid adaptation adapter 13 is located, which has a multitude of adapter pins 14 extending through it, which link the testing contacts 7 arranged in the grid with the testing points 3 arranged out of grid. The adapter pins 14 do not lie, therefore, in the respective alignment with the testing contacts, but rather extend aslant through the adapter 13, in which case they project with both ends out of the adapter and form contact places which are raised compared with the upper and lower side.

From FIG. 2 the construction of the adapter 13 can be seen. The adapter 13 consists of a lower guide plate 15 with guide holes 16 arranged in the pattern of the testing points of the printed circuit board 2 to be tested which is not portrayed in FIG. 2, and an upper guide plate 17 extending parallel to it at a distance above, with guide holes 18 for the adapter pins 14 arranged in the grid. The guide plate 15 and the guide plate 17 form, with fore plates 19 fastened to them on the fore side, a box shape.

The adapter pins 14 can be introduced from above through the guide holes 16, 18 and they have at their upper ends spherical heads 21, which rest in the fully introduced position against the edges 22 of the guide holes 18. Five adapter pins 23 to 27 are portrayed, of which the adapter pins 23 to 25 are fully introduced, whilst the adapter pins 26 and 27 stand up on the guide plate 15. Whilst the guide holes 16, 18 for the adapter pins 23 and 26 are flush with one another, that is lying in the grid, the guide holes 16, 18 for the adapter pins 24, 25 and 27 are not flush with one another, because these guide holes in the guide plate 15 are located out of grid, whereby an aslant position of the fully introduced adapter pins 24, 25 and 27 is called for.

The adapter 13 is located on an assembly holder 31 for the purpose of the introduction of the adapter pins 23 to 27, which are introduced by hand. Below the guide plate 15, in the assembly holder 31, a mirror 32 is fastened, which is inclined to the front side of the adapter 13, i.e. to the side on which the operator stands. A handlamp portrayed by way of a suggestion and designated by 33 is located above the guide plate 17 and is held for example in one hand by the operator. The guide plate 17 consists of a synthetic material, which is not transparent, yet lets through a definite amount of light, so that the guide plate 15 is also still lit by the light rays of the hand lamp 33. Since the guide plate 15 likewise consists of a material which is slightly translucent, the shadow thrown onto the guide plate 15 by the adapter pins 26, 27 is visible from below. Therefore, not only the guide holes 16 of the guide plate 15, but also the shadows designated by 34 are outlined on the mirror 32. The operator can, by reason of this shadow illustration, recognise on which side of the relevant guide hole 16 the relevant adapter pin points are located. Through corresponding steering movements of the adapter pins 26, 27, which are brought about through manual contact on the spherical heads 21, the adapter pin points can be introduced, directed to fixed objectives, into the appertaining guide holes 16.

With the exemplary embodiment according to FIG. 2 the amount of deviation designated by a is defined through the diameter d of the guide holes 18, through which the adapter pins 14 extend, with a certain movement clearance.

With the second exemplary embodiment according to FIG. 4, between the guide plate 15 and the guide plate 17 a central guide plate 35 is arranged parallel to them, which can, with the aid of two piston cylinders 36, whose piston rods 37 pass through the holes 38 in guide plate 15, be adjusted vertically, namely between a lower position, shown by a dot-dash line, which is limited by stops 39, and an upper position, shown by continuous lines. The central guide plate 35 has guide holes 41, whose diameter D is larger than the diameter d of the adapter pins 14. The amount of deviation a is defined in this case through the size of the guide holes 41. Through the moving of the central guide plate 35, the movement clearance space on all sides for the adapter pins 14 and thus the amount of deviation a can be altered, if the adapter pins 14 are located above the guide plate 15. In the lower position of the plate 35, the amount of deviation a is smaller than in the upper position.

If the same grid sizes are always present, it can also be advantageous, to arrange a central plate 35 rigidly about in the position portrayed in FIG. 4 in dot-dashed or continuous lines.

Figure 5:
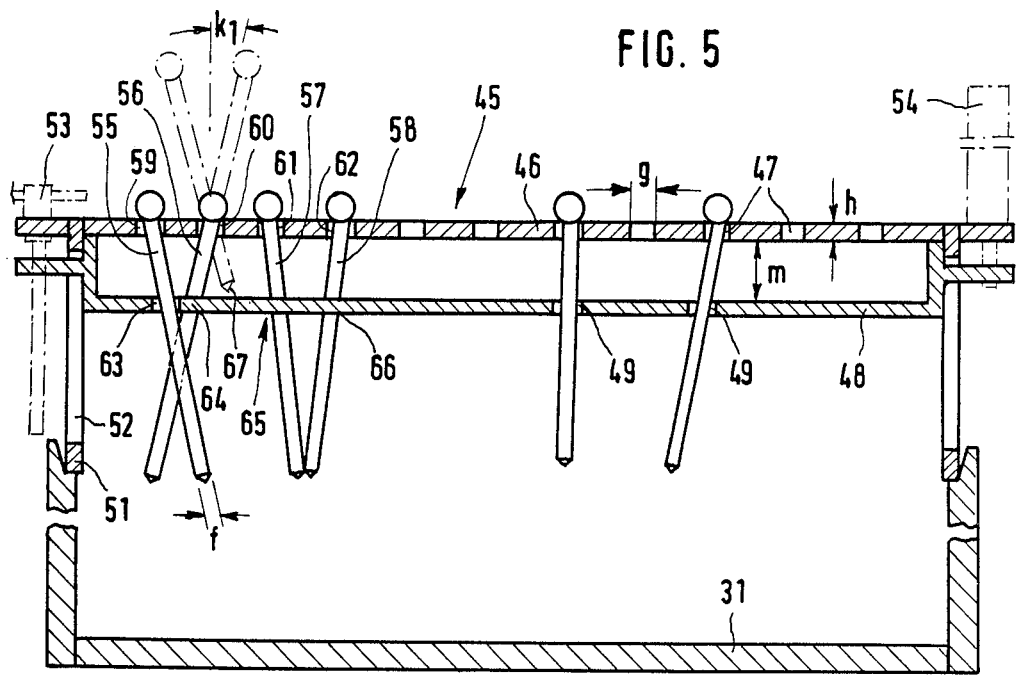
FIG. 5 a perpendicular section through an adapter in another embodiment.
Figure 6:
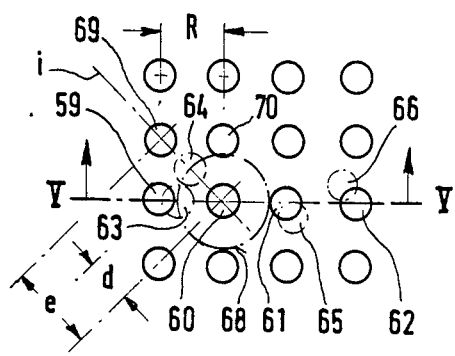
FIG. 6 a cutout of the adapter according to FIG. 5 in plan view.
Figure 7:
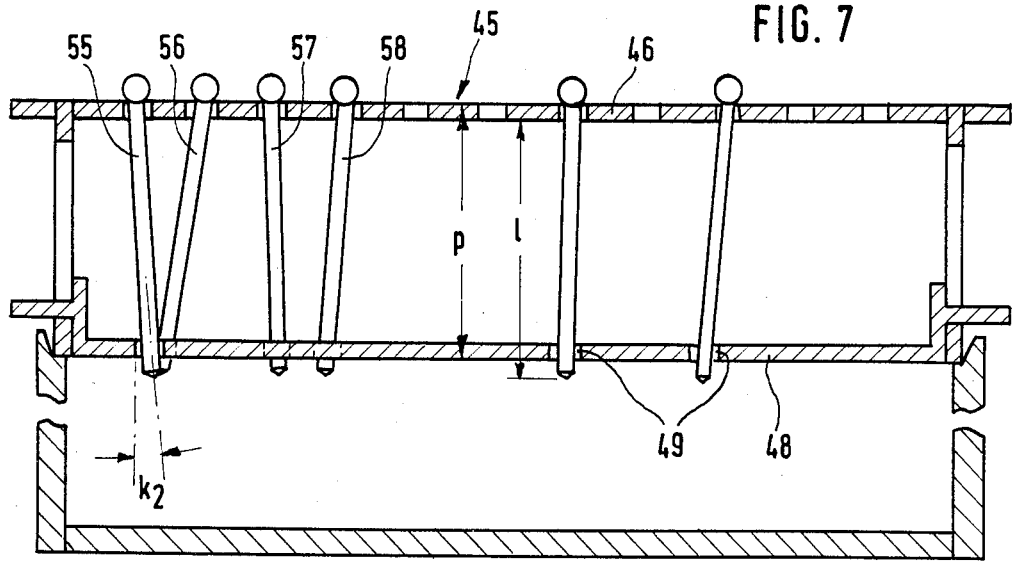
FIG. 7 the adapter according to FIG. 5 in its working position.

With the embodiment according to FIGS. 5 to 7, the adapter designated here by 45 has likewise a box construction. It comprises of a first guide plate 46 with guide holes 47 at all grid points and with a second guide plate 48 with guide holes 49 in the pattern of the testing points of the printed circuit board to be tested. The first guide plate 47 is transparent and consists, in a preferred embodiment, of plexiglass. The second guide plate 48 does not need to be transparent and consists, in a preferred embodiment, of a synthetic material, strengthened with glass fibres, on an epoxy resin basis, which is designated in technical language by EPG. In the fore plates 51 linking the guide plates 46, 48 to one another, guides 52 in the form of guide slits are developed, in which the second guide plate 48 can be adjusted, for the purpose of distance alteration, between the guide plates 46, 48 vertically between an assembly position portrayed in FIG. 5 and a working position portrayed in FIG. 7. The adjustment of the second guide plate 48 can be served by a mechanism, which is portrayed by way of a suggestion in FIG. 5 as a spindle drive 53 or a cylinder piston drive 54.

Of the present adapter pins four are designated by 55 to 58 and described in particular further below.

FIG. 5 shows the guide plates 46, 48 and the adapter pins 55 to 58 in a section along the line V—V in FIG. 6, which shows a corresponding cutout of FIG. 5 in top view. The adapter pins 55 to 58 are, in the assembly position of the guide plate 48, pushed in from above through the guide holes designated by 59 to 62 in the first guide plate 46 and the guide holes designated by 63 to 66 in the second guide plate 48. Of the guide holes in the second guide plate 48, that designated by 64 is distant by a maximum distance d from the grid point allocated to it, namely the guide hole 60. The guide holes 63, 65 and 66 in the second guide plate 48 (FIG. 6) have a smaller distance from the grid points allocated to them, namely guide holes 59, 61 and 62 in the first guide plate 46. The distance d amounts to half the diagonal extent e of a grid of four adjacent guide holes 47 in the first guide plate 46 arranged in a square, the size of such a grid being designated by R. The diameter f of the adapter pins, the diameter g of the guide holes 47 in the first guide plate 46 and the thickness h of the first guide plate 46 are matched to one another, namely in such a way that the points 67 of the adapter pins 55 describe a gyrating circle 68, when an adapter pin, with its point 67 resting against the second guide plate 48, is moved in the sense of a gyrating movement, as is indicated for example by dot-dashed lines in FIG. 5. The above-described dimensions are matched to one another, so that the maximum radius of the gyrating circle 68 corresponds to half the diagonal extent e and thus to the distance d.

The guide hole 64 in the second guide plate 48 has the peculiarity that it lies on the diagonal i. As a result of this it has the same distance d from the guide holes designated by 59, 60 and 69, 70. That is, the adapter pin 56, which can still just be pushed in with some difficulty through the guide hole 60 into the guide hole 64, by reason of the previously named dimensions, could also be introduced from any one of the guide holes 59 and 69 and 70, likewise still just with difficulty, into the guide hole 64. The assembly of such holes 64 in the second guide plate 48, which lie in the intersection of diagonals i, which go through guide holes 59, 60, 69, 70, arranged in a square, is thus quadrupally indefinite. This difficulty is calculated for, in that the automatic testing machine is in a position to learn the arrangement of the adapter pins which is present in the adapter, and to re-programe itself accordingly. The angle of deviation of the pin, which the adapter pins adopt compared with the perpendicular, is designated by $k_1$ in the assembly position according to FIG. 5, irrespective of its size. Through the moving of the second guide plate 48 into the working position portrayed in FIG. 7, the angles of deviation of the pins diminish. The diminished angles are designated in FIG. 7 by $k_2$. Hereby the smooth running of the adapter pins and certainly in particular of the adapter pins which are plugged into guide holes 64, which lie on the intersection of diagonals i, is guaranteed. A mutual contact of adapter pins 55 to 58 is avoided through the extending of the guide plates 46, 48, because the adapter pins 55 to 58 thereby distance themselves from one another.

For the above described embodiment the following dimension details are made in addition:
thickness h of the first guide plate 46 = 1.5 mm
thickness l of the second guide plate 48 = 1.5 mm
diameter of the guide holes in the first and second guide plate 46, 48 = 1.7 mm
separation m of the guide plates 46, 48 in the assembly position = 3.5 mm,
diameter of the adapter pins = 1.35 mm,
grid distance R of the guide holes 47 in the first guide plate = 2.54 mm.

Figure 8:
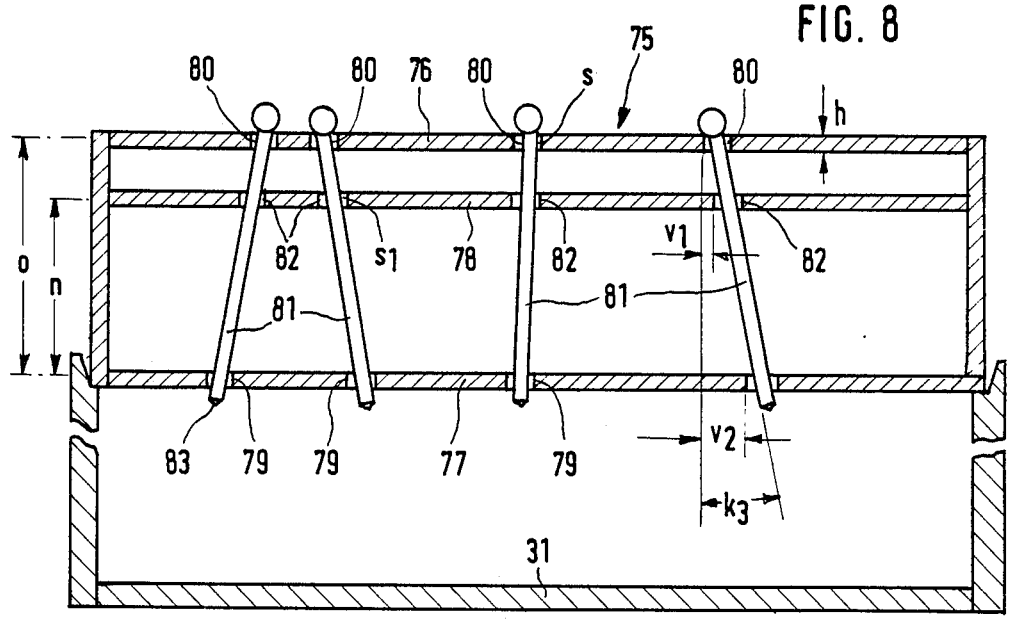
FIG. 8 a perpendicular section through an adapter in a further embodiment.

With the further embodiment according to FIG. 8, the adapter designated here by 75 has an upper first guide plate 76, a lower second guide plate 77 and a third guide plate 78 arranged between them. As with the previously described embodiments, the guide plates 76 to 78 are arranged parallel to one another. By contrast to the embodiment according to FIG. 4, the third guide plate 78 is arranged rigidly here. It could certainly be alterable in distance, however, only for the purpose of its basic positioning. An alteration in distance at every assembly is not provided for.

The adapter 75 of this embodiment is 100% reproducible. That means that the assembly of guide holes 79, in the second guide plate 77, lying outside the grid, may not be undefined. In other words, each guide hole 79 in the second plate 77 is allocated for the assembly a quite definite guide hole 80 in the first guide plate 76. The guide holes 80 in the first guide plate 76 are arranged in the grid. By contrast with the embodiment according to FIGS. 5 to 7, however, not at all grid points, but rather only at those which, for assembly of the special adapter 75, should receive adapter pins 81. The third guide plate 78 is provided with guide holes 82, which can lie in and out of grid.

The guide holes 82, lying out of grid, in the third guide plate 78 are, however, compared with the nearest guide holes 80, located in the grid, of the first guide plate 76, displaced less far ($v_1$) than the corresponding guide holes 79 in the second guide plate 77 ($v_2$). The displacement $v_1$ of the guide holes 82 in the third guide plate 78 lying out of grid is chosen so that—when the displacement $v_1$ is a maximum one—the in particular conical point 83 of the adapter pins 81 still dips in every case into the guide holes 79 of the second guide plate 77, irrespective of the angle of deviation of the pin $k_3$ under which the adapter pins 81 are plugged-in in the first guide plate 76. The displacement $V_1$ of the guide holes 82, located out of grid in the third guide plate 78, is determined in knowledge of the displacement $v_2$ of the guide holes 79, located out of grid, in the second guide plate 77, for example calculated by a computer.

In comparable fashion as with the embodiment according to FIG. 5, also with the embodiment according to FIG. 8, the thickness h of the first guide plate 76 and the movement clearance s of the adapter pins 81 in the guide holes 80, as well as the movement clearance s, in the guide holes 82 of the third guide plate 78, are matched to one another so that the, if necessary pointed, points 83 of the adapter pins 81 dip into the guide holes 82 on plugging-in.

To the exemplary embodiment according to FIG. 8 the following dimension variables are given:
thickness of each of the three guide plates 76 to 78=1.7 mm
diameter of all guide holes 79, 80, 82=1.7 mm
diameter of the adapter pins 81=1.35 mm
the third guide plate 78 has a distance n to the second guide plate 77, which amounts to about 80% of the distance o between the first guide plate (76) and the second guide plate (77).

With all embodiments the adapter pins have a cylindrical shaft, a spherical head and a preferably conical point. The pin length l measures more than the transverse dimension p of the adapter by about the size of the spherical head.

Figure 9:
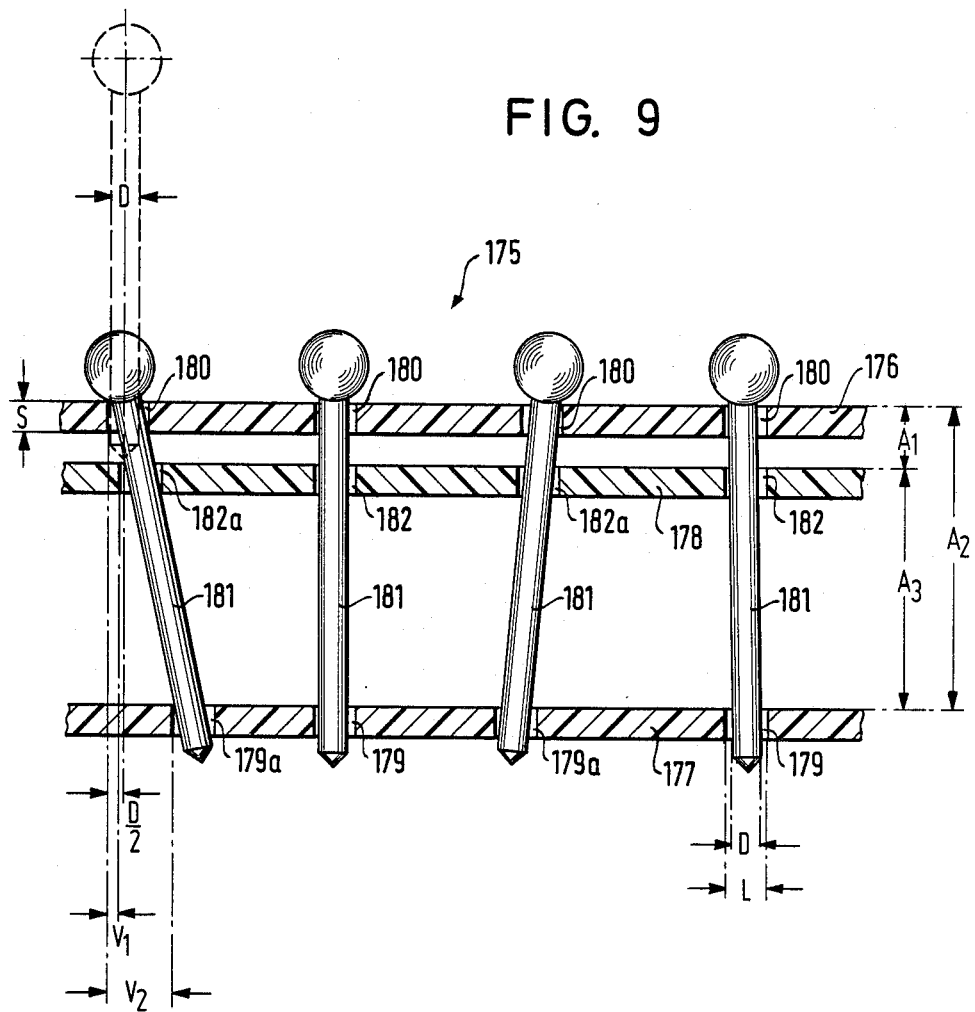
FIG. 9 a schematic sectional view of an adapter consisting of three guide plates with particular dimensioning of the guide holes of the third guide plate.

FIG. 9 shows another adapter, which comprises a first guide plate 176, a second guide plate 177 and a third guide plate 178 arranged in between. In the first guide plate 176 are holes 180 located in the grid. In the second guide plate 177 are the guide surface 179 likewise located in the grid, as well as guide holes 179a located out of grid. The third guide plate 178 has guide holes 182 likewise located in the grid as well as guide holes 182a located out of grid. The displacement of the guide holes 182a, located out of grid, of the third guide plate compared with the corresponding guide holes 180 in the first guide plate 176 is so chosen here that, with perpendicular introduction of an adapter pin 181 into a guide hole 180 of the first guide plate 176, it is guaranteed, on each, that the conical point of the adapter pin 181 still enters into the corresponding guide hole 182a, located out of grid, of the third guide plate 178 and on the other hand—when the adapter pin 189 is guided further through the guide hole 182—this adapter pin 181 is inevitably led into the corresponding guide hole 179a located out of grid. In this fashion, in particular with the application of an automatic loading system according to DE-OS No. 33 40 184, a practically 100% efficiency with the loading within the shortest time is guaranteed. It is a significant feature of the invention that the adapter pins 181 can be definitely introduced always perpendicularly into the guide holes 180 of the first guide plate, namely irrespective of whether the guide holes in the second guide plate 177 are in the grid or out of grid.

The position of the guide holes 180 of the first guide plate 176 are given through the grid. The position of the guide holes 179, 179a in the second guide plate 177 is given through the hole picture of the printed circuit board to be tested. The displacement of the guide holes 182a in the third guide plate 178 can be calculated taking into account the previously named conditions and position data, whereto in particular a computer is suitable. Thereto the plate diameter S, the pin diameter D, the hole diameter L, as well as the distances of the guide plated $A_1$, $A_2$ and $A_3$ must be chosen so that the above mentioned desired condition can always be realised, ie even when the displacement $V_2$ between a guide hole 180 in the first guide plate 176 and a guide hole 179a in the second guide plate 177, with regard to the reproducibility of an adapter loading diagram, is a maximum.

In FIG. 9, in particular with the left adapter pin 181, it can be seen that half the diameter of the adapter pin D/2 is greater than the displacement $V_1$ between the guide hole 180 of the first guide plate 176 and the guide hole 182a in the third guide plate 178. Thereby it is guaranteed that the adapter pin 181 still goes home with its point, on perpendicular introduction (designated in dashed lines), into the diameter region of the guide hole 182a of the third guide plate 178, is then turned around and so continued that it finally goes home inevitably into the guide hole 179a of the second guide plate 177.

Figure 10:
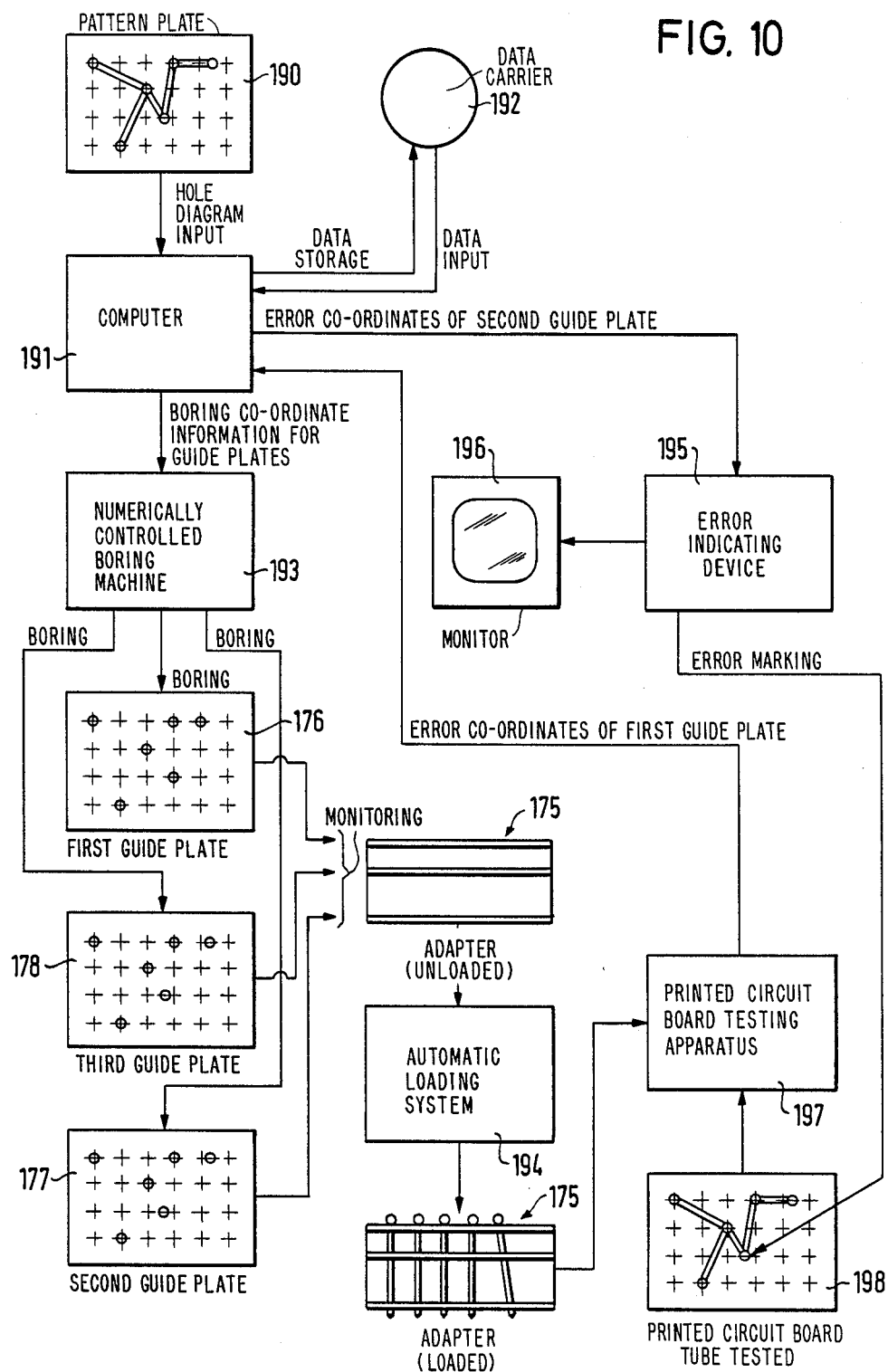
FIG. 10 a graphic portrayal, which shows the course of a method for fixing and indicating location of errors on a printed circuit board to be tested.

The method progression portrayed in FIG. 10 for indicating locations of errors on a printed circuit board to be tested is as follows: by reason of a pattern plate 190 corresponding to a printed circuit board to be tested 198, a hole diagram is input into a computer 191. The data corresponding to the hole diagram can be stored off on a data carrier, for example a diskette 192. It is equally possible to call the data back again from the data carrier 192 and input the data into the computer 191. The computer 191 now calculates the bore diagram for the holes of the guide plates of the adapter according to FIG. 9. The data or co-ordinates for this bore picture are input into an NC-boring machine 193, by means of which the three guide plates 176, 177 and 178 are bored. After the boring the guide plates are assembled to the (still unloaded) adapter 175. This is then put in an automatic loading device 194 according to DE-OS No. 33 40 184. The adapter 175 loaded with adapter pins can be taken from the automatic loading device 194. This loaded adapter 175 is then supplied to a printed circuit board testing apparatus 197 together with the printed circuit board 198 to be tested.

The printed circuit board testing apparatus determines the data or co-ordinates of those testing contacts, which rest against the spherical heads of the adapter pins. The testing contacts lie on the side of the first guide plate 176, that is all in the grid. Via the adapter pins these testing contacts stand connected to holes, affected by errors, of the printed circuit board 198 to be tested. The holes affected by errors, of the printed circuit board 198 to be tested should be indicated. These, however, are partially out of grid, i.e. they lie on the side of the second guide plate 177. In order now to determine the data or co-ordinates of the holes, affected by errors, on the printed circuit board to be tested, the data or co-ordinates, determined by the printed circuit board testing apparatus 197, of the testing contacts located in the grid are again supplied to the computer 191.

The computer knows, by reason of the calculating data for the bore diagrams of the three guide plates, the correlation between the data or co-ordinates of the testing points (holes), affected by errors, on the printed circuit board to be tested on the one hand, and the data or co-ordinates of the testing contacts of the printed circuit board testing apparatus 197 on the other hand. The computer 191 transmits, correspondingly thereto, to an error indicating device 195 the data or co-ordinates of the testing points, affected by errors, of the printed circuit board 198 to be tested, which correspond to the error co-ordinates or data of the holes in the second guide plate 177. These data or co-ordinates are indicated on a monitor 196 and can be used by an operator, using an optical search apparatus with co-ordinate indicator, to find the testing points, affected by errors on the printed circuit board 198 to be tested. It is, however, also possible to design the error indicating device 195 so that it indicates testing points or holes, affected by errors, on the printed circuit board 198 to be tested directly, for example by means of a light point, which is produced by a projector head which can be moved in two co-ordinate directions.

We claim:

1. Adapter for a printed circuit board testing apparatus, by means of which testing contacts located in a grid can be connected through adapter pins to testing points, located in and/or out of grid, of a printed circuit board to be tested, said adapter comprising first and second guide plates arranged parallel to one another and at a distance from one another and having guide holes into which adapter pins can be plugged, the guide holes in the first guide plate being arranged in the grid and in the second guide plate in the pattern of the testing points of a printed circuit board to be tested, the first guide plate having guide holes at all grid points, the distance between the first and second guide plates being alterable between a working position, in which the guide plates have a separation shorter than the length of the adapter pins, and an assembly position, in which the guide plates have a separation from one another which is reduced compared with the working position, and in that the separation in the assembly position is so chosen that an adapter pin to be introduced into a guide hole of the second guide plate can, as a result of a maximum angle of deviation of the pin defined by the pin diameter as well as the diameter and the length of the guide holes of the first guide plate, be introduced through one of at most four guide holes, arranged next to one another in a square, of the first guide plate.

2. Adapter according to claim 1 wherein the first guide plate is transparent.

3. Adapter according to claim 1 wherein there is provided a guide between first and the second guide plates for adjusting the first and/or the second guide plate.

4. Adapter according to claim 1 wherein there is provided an adjusting mechanism for adjusting the first and/or second guide plate.

5. Adapter for a printed circuit board testing apparatus, by means of which testing contacts located in a grid on the testing apparatus can be connected through adapter pins to testing points, located in and/or out of grid, of a printed circuit board to be tested, said adapter comprising first, second and third guide plates arranged parallel to one another and at a distance from one another, the third guide plate positioned between the first and the second guide plates, the guide plates having guide holes, into which adapter pins can be plugged-in, the first guide plate having guide holes only at the grid locations to which testing contacts are allocated at the testing apparatus, the second and third guide plates having guide holes only at locations corresponding to the locations of testing contacts at the printed circuit board, the guide holes lying out of grid, of the third guide plate, being displaced less far with respect to corresponding grid locations than the likewise corresponding guide holes lying out of grid, of the second guide plate in such a way that they lie in guide alignment between two guide holes allocated to one another, in the first and second guide plates.

6. Adapter according to claim 5, wherein the distance between the third guide plate and the second guide plate amounts to about 80% of the distance between the first guide plate and the second guide plate.

7. Adapter according to claim 5, wherein the lower guide plate is translucent.

8. Adapter according to claim 7, wherein a mirror is arranged below the lower guide plate.

9. Adapter according to claim 7 wherein a light source is arranged above the lower guide plate.

10. Adapter according to claim 7, wherein a central guide plate is arranged parallel to and between the lower and the upper guide plates, the guide holes of the central guide plate being provided in all grid points and having a diameter which allows a limited steering clearance of the adapter pins.

11. Adapter according to claim 7, wherein at least one of the central guide plate and the upper guide plate is translucent.

12. Adapter according to claim 10 or 11, wherein the central guide plate is movable perpendicular to the lower and upper guide plates.

13. Adapter according to claim 1, wherein the adapter pins have spherical heads.

14. Adapter according to claim 9, wherein the light source is a hand lamp arranged above the upper guide plate.

15. Adapter for a printed circuit board testing apparatus, by means of which testing contacts located in a grid can be connected to testing points, located in and/or out of grid, of a printed circuit board to be tested, through adapter pins, whose ends turned towards the testing points taper conically, with first and second guide plates and a third guide plate lying between the first and second guide plates, all three guide plates arranged parallel and at fixed distances to one another and having guide holes for the adapter pins, the first guide plate having guide holes located in the grid and the second guide plate guide holes located in and/or out of grid, which coincide with the testing points of the printed circuit board to be tested, and the third guide plate having guide holes located in and/or out of grid, the guide holes located out of grid, of the third guide plate being placed so that, the adapter pins with perpendicular introduction into the guide holes of the first guide plate, enter with their conically tapering ends into the guide holes located out of grid of the third guide plate and, with further movement, are steered through these guide holes, located out of grid, of the third guide plate into the guide holes located out of grid, of the second guide plate.

16. Adapter according to claim 15, wherein the distance between the first guide plate and the third guide plate is smaller than the distance between the third guide plate and the second guide plate.

17. Adapter according to claim 15, wherein the distance between the second guide plate and the third guide plate amounts to around 80% of the distance between the first guide plate and the second guide plate.

18. Adapter according to claim 15, wherein the thickness of the guide plates, the diameter of the guide holes, the separations of the guide plates and the diameter of the adapter pins are so chosen that the adapter pins are properly positioned for all testing points, located out of grid, of a printed circuit board to be tested.

19. Method for indicating the location of errors on a printed circuit board to be tested, said printed circuit board having testing points located in and/or out of grid, said method involving use of an adapter having first and second guide plates and a third guide plate therebetween, the first plate having holes lying in a grid and the second and third plates having holes located in and/or out of the grid and adapter pins which can extend through the holes and a printed circuit board testing apparatus containing the adapter, to which the printed circuit board to be tested is supplied, said method comprising the steps of supplying to a computer data of the co-ordinates of all contact holes of the printed circuit board to be tested, causing the computer to calculate the co-ordinates of the bore holes for the three guide plates, then boring the holes corresponding the calculated co-ordinates into the three guide plates, thereafter assembling, from the three guide plates, the adapter and introducing the adapter pins to the assembly, supplying the adapter, with the printed circuit board to be tested, to the printed circuit board testing apparatus, thereupon, transmitting to the computer the data or co-ordinates, determined by the printed circuit board testing apparatus, of those testing contacts located in the testing apparatus grid, which correspond to printed circuit board testing points affected by errors, causing the computer to determine, by reason of these data or co-ordinates, the data or co-ordinates of the corresponding testing points of the printed circuit board to be tested, and causing an indicating apparatus to indicate the last mentioned data or co-ordinates.

20. Adapter according to claim 2 wherein there is provided a guide between the first and second guide plates for adjusting the first and/or second guide plate.

21. Adapter according to claim 8 wherein a light source is arranged above the lower guide plate.

* * * * *